US005670902A

United States Patent [19]

Nakagawa et al.

[11] Patent Number: 5,670,902

[45] **Date of Patent: *Sep. 23, 1997**

[54] SATELLITE BROADCAST RECEIVING SYSTEM AND CHANGE-OVER DIVIDER FOR USE IN SAME

[75] Inventors: Yutaka Nakagawa; Tadashi Kajiwara, both of Kanagawa; Keiji Fukuzawa, Chiba; Keiji Yuzawa, Tokyo, all of Japan

[73] Assignee: Sony Corporation, Tokyo, Japan

[ * ] Notice: The term of this patent shall not extend beyond the expiration date of Pat. No. 5,301,352.

[21] Appl. No.: 671,318

[22] Filed: Jul. 19, 1996

Related U.S. Application Data

[63] Continuation of Ser. No. 513,576, Aug. 10, 1995, Pat. No. 5,565,805, which is a continuation of Ser. No. 140,842, Oct. 25, 1993, abandoned, which is a division of Ser. No. 904,557, Jun. 26, 1992, Pat. No. 5,301,352.

[30] Foreign Application Priority Data

Jul. 4, 1991 [JP] Japan .................................... 3-164103

[51] Int. Cl.[6] .................................................... H03K 17/00

[52] U.S. Cl. .............................. 327/99; 455/3.1; 455/3.2; 455/4.2; 455/132; 348/6; 348/10

[58] Field of Search ............................ 327/99, 403, 407; 455/3.2, 3.3, 4.2, 6.1, 6.2, 3.1, 132; 370/53, 112; 348/6, 10

[56] References Cited

U.S. PATENT DOCUMENTS

| | | | |
|---|---|---|---|
| 5,010,400 | 4/1991 | Oto | 348/11 |
| 5,382,982 | 1/1995 | Enomoto | 348/706 |
| 5,386,226 | 1/1995 | Chanteau | 348/10 |
| 5,386,587 | 1/1995 | Yuzawa | 455/3.2 |
| 5,416,534 | 5/1995 | Hayashi et al. | 348/687 |
| 5,565,805 | 10/1996 | Nakagawa et al. | 327/99 |

*Primary Examiner*—Timothy P. Callahan
*Assistant Examiner*—Kenneth B. Wells
*Attorney, Agent, or Firm*—Jay H. Maioli

[57] ABSTRACT

A satellite broadcast receiving system in which, when each receiver transmits a control pulse to a change-over divider via a signal cable, the change-over divider selects a desired broadcast signal in response to the control pulse, which is led to its output terminal, then transmitted to each receiver via the signal cable.

7 Claims, 3 Drawing Sheets

SATELLITE BROADCAST RECEIVING SYSTEM AND CHANGE-OVER DIVIDER FOR USE IN SAME

This is a continuation of application Ser. No. 08/513,576 filed Aug. 10, 1995, now U.S. Pat. No. 5,565,805, which is a continuation of application Ser. No. 08/140,842, filed Oct. 25, 1993, now abandoned, which is a divisional of application Ser. No. 07/904,557, filed Jun. 26, 1992, now U.S. Pat. No. 5,301,352.

BACKGROUND OF THE INVENTION

The present invention relates to a satellite broadcast receiving system and a change-over divider for use in this system.

In the near future, satellite broadcast-may include Communication Satellite (CS) broadcast using a communication satellite in addition to Broadcast Satellite (BS) broadcast. Further, CS broadcast may be performed by a plurality of communication satellites. Due to the fact that the height and position of the broadcast satellites and communication satellites are different from each other, a receiver cannot catch all radio waves transmitted therefrom by a single satellite antenna, and thus it should be provided with a plurality of satellite antennas. Additionally, due to overlap of the transmission frequency band of a signal for each broadcast, a single signal cable is not sufficient to transmit signals at the same time.

Accordingly, when dividing broadcast signals among a plurality of receivers by using a plurality of common satellite antennas, signal cables corresponding to the number of signals are needed to connect a change-over divider to each receiver, resulting in extremely complicated connection. Further, some people cannot utilize a plurality of signal cables, as limited by their domestic conditions.

It is, therefore, an object of the present invention to provide a satellite broadcast receiving system and a change-over divider for use in this system which contribute to a simplification of the architecture and a reduction in manufacturing cost.

SUMMARY OF THE INVENTION

According to one aspect of the present invention, there is provided a system for receiving broadcast and communication signals, comprising:

a plurality of antennas disposed to receive the broadcast and communication signals;

a change-over divider connected to said plurality of antennas and having a plurality of output terminals, said change-over divider separately outputting a predetermined one of the broadcast and communication signals to said plurality of output terminals, respectively; and a plurality of receivers connected to said plurality of output terminals of said change-over divider, said plurality of receivers providing a control pulse to said change-over divider for selecting one of said plurality of antennas, respectively.

According to another aspect of the present invention, there is provided a change-over divider for selecting signals, comprising:

a plurality of input terminals;

a plurality of switches connected to said plurality of input terminals;

a plurality of output terminals connected to outputs of said plurality of switches;

control pulse detection circuit means connected to said plurality of output terminals for detecting a control pulse; and a microcomputer connected to said plurality of switches and said control pulse detection circuit means, said microcomputer decoding said control pulse, said microcomputer outputting a change-over control signal to said plurality of switches in response to said control pulse as decoded, said plurality of switches selecting a predetermined one of the signals in response to said change-over control signal of said microcomputer.

DETAILED DESCRIPTION OF THE INVENTION

Figure 1:
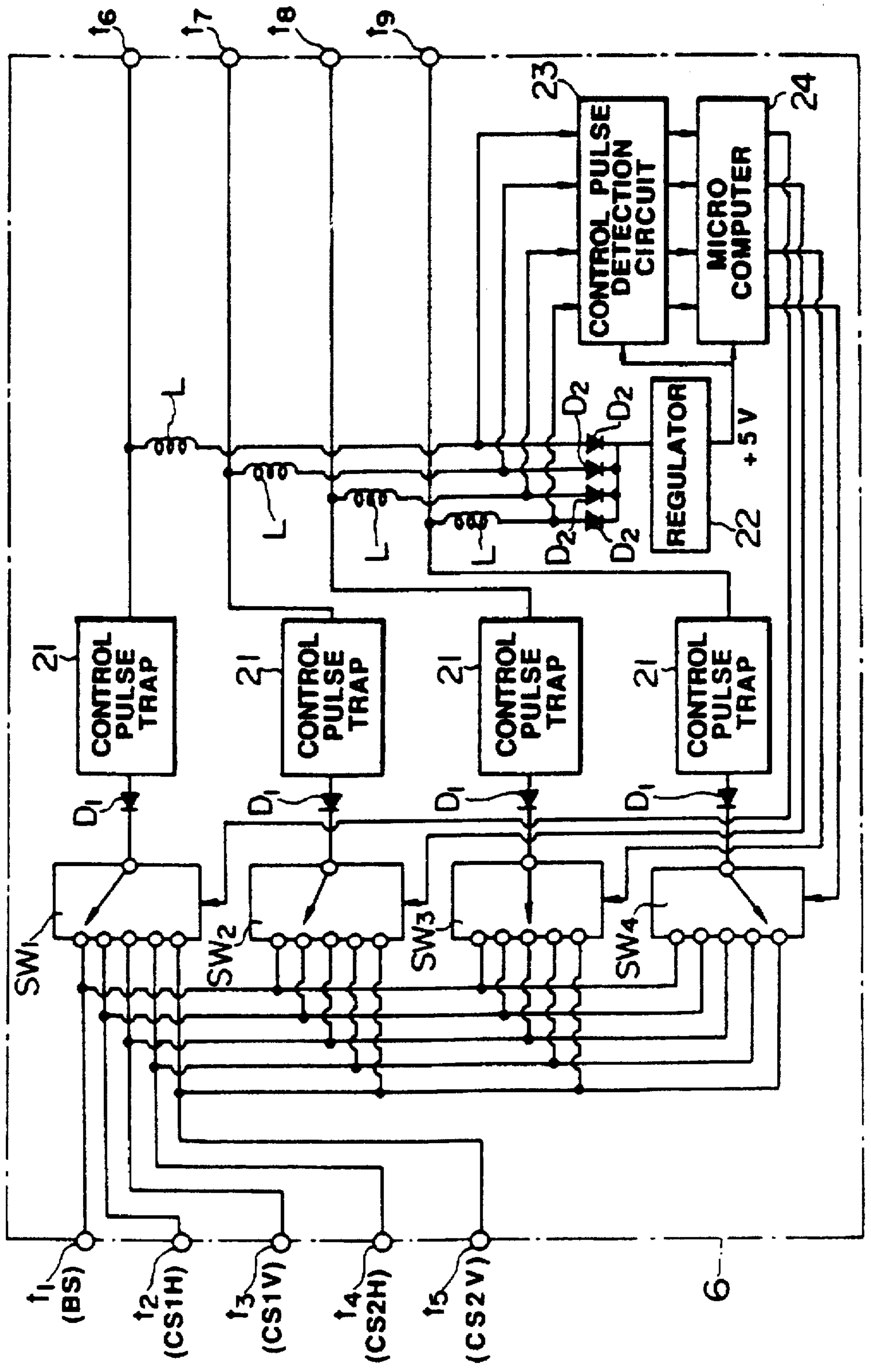
FIG. 1 is a circuit block diagram showing a change-over divider (first Preferred embodiment)

Referring to the drawings, wherein like reference numerals designate corresponding parts throughout the views, referring first to FIGS. 1 and 2, a first preferred embodiment of the present invention will be described. FIG. 2 shows a circuit block diagram of a satellite broadcast receiving system. Three antennas are disposed as satellite antenna: BS antennas 1, $CS_1$ antenna 2, and $CS_2$ antenna 3. The BS antenna 1 serves to collect BS broadcast wave, and the $CS_1$ antenna 2 serves to collect $CS_1$ broadcast wave, and the $CS_2$ antenna 3 serves to collect $CS_2$ broadcast wave.

BS broadcast wave as collected by the BS antenna 1 is a circularly polarized wave, and it is received in a BS converter 4. A single BS broadcast signal is converted in the BS converter 4 to have a predetermined frequency, then led to a first input terminal $t_1$ of a change-over divider 6 via a signal cable 5.

$CS_1$ broadcast wave as collected by the $CS_1$ antenna 2 is composed of two linearly polarized waves which meet at right angles, and it is received in a $CS_1$ converter 7. A horizontally polarized broadcast signal and a vertically polarized broadcast sisal are converted in the $CS_1$ converter 7 to have a predetermined frequency, respectively, then led to second and third input terminals $t_2$, $t_3$ of the change-over divider 6 via two sisal cables 8, 9, respectively.

$CS_2$ broadcast wave as collected by the $CS_2$ antenna 3 is composed of two linearly polarized waves like the $CS_1$ broadcast wave, and it is received in a $CS_2$ converter 10. A horizontally polarized broadcast signal and a vertically polarized broadcast signal are converted in the $CS_2$ converter 10 to have a predetermined frequency, respectively, then led to fourth and fifth input terminals $t_4$, $t_5$ of the change-over divider 6 via two signal cables 11, 12, respectively.

The change-over divider 6 has four output terminals $t_6$–$t_9$, and separately selects a desired one of the five input broadcast signals as an output. A detailed architecture thereof is shown in FIG. 1. The output terminals $t_6$–$t_9$ are connected to signal cables 13–16 at ends thereof, respectively. The signal cables 13–16 have the other ends connected to BS/CS receivers 17–20, respectively.

The BS/CS receivers 17–20 are constructed to output converter power supply (DC power voltage) via the signal cables 13–16 when turned on by a power switch. Additionally, the BS/CS receivers 17–20 each have a broadcast selecting switch, which permits selection of five kinds of broadcast such as BS broadcast, $CS_1$ horizontally polarized wave broadcast, etc. Information selected by the broadcast selecting switch is converted into a control pulse in a pulse code circuit, which is output together with the converter power supply via each of the signal cables 13–16.

Figure 2:
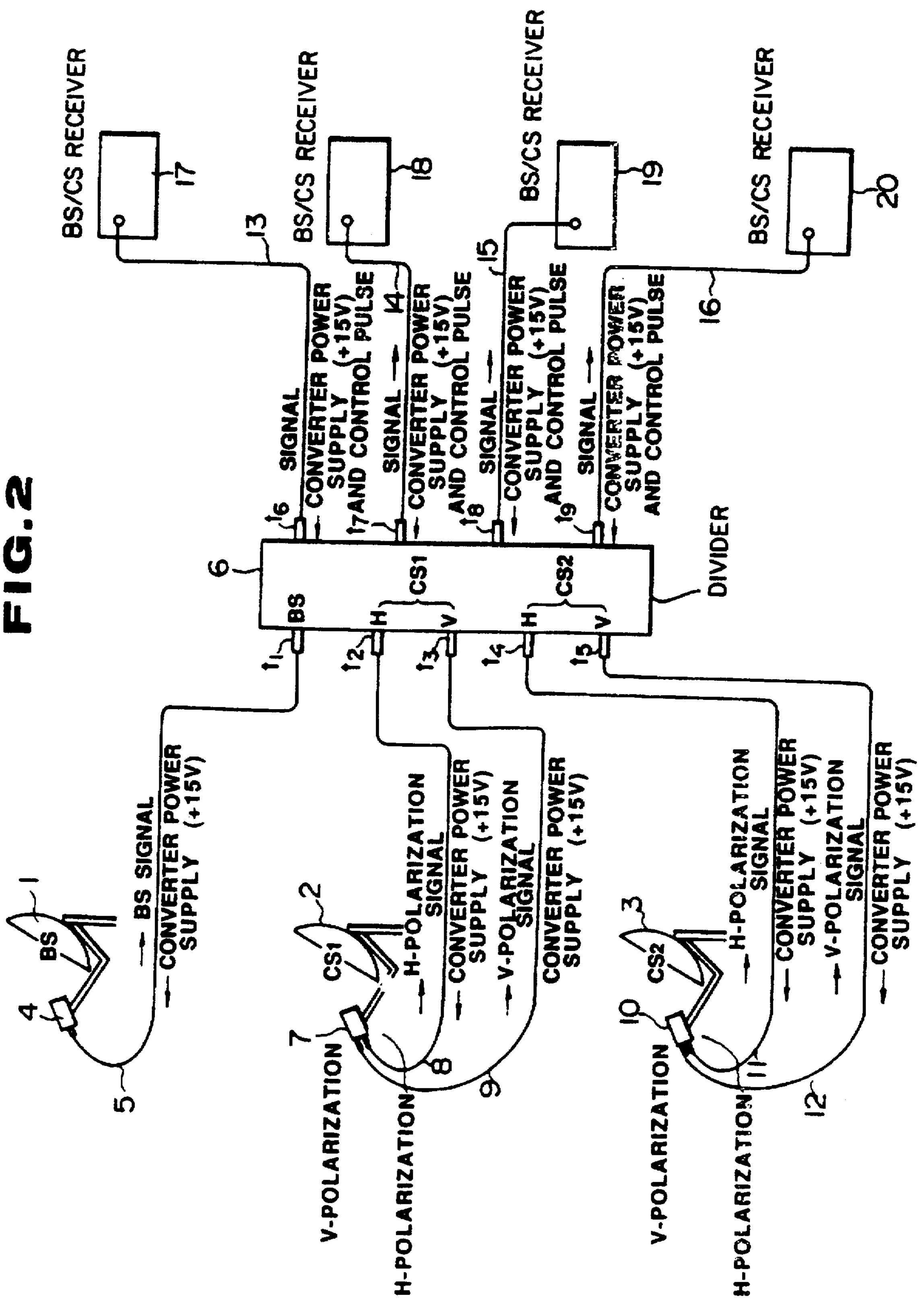
FIG. 2 is a view similar to FIG. 1, showing a satellite broadcast receiving system (first preferred embodiment)

FIG. 1 shows a circuit block diagram of the change-over divider 6. The change-over divider 6 is provided with first to fourth change-over switches $SW_1$–$SW_4$ corresponding to the number of the output terminals $t_6$–$t_9$, each receiving all the five input broadcast signals. The change-over switches $SW_1$–$SW_4$ select one of the five broadcast signals in response to the change-over control signal, respectively. This broadcast signal as selected is provided to the output terminals $t_6$–$t_9$ via a diode $D_1$ and a control pulse trap circuit 21.

The output terminals $t_6$–$t_9$ are connected via a coil L and a diode $D_2$ to a regulator 22, respectively which provides constant voltage to a control pulse detection circuit 23 and a microcomputer 24. Additionally, the output terminals $t_6$–$t_9$ are connected via the coil L to the control pulse detection circuit 23, respectively, which detects the control pulse as transmitted to output the control pulse to the microcomputer 24.

The microcomputer 24 decodes the control pulse, and outputs the change-over control signal to the first to fourth change-over switches $SW_1$–$SW_4$ corresponding to the output terminals $t_6$–$t_9$ to which selected information is input in accordance with this selected information as decoded.

Next, the operation of this embodiment will be described. One of the four BS/CS receivers 17–20, for example, the BS/CS receiver 17 is turned on by the power switch, and selects BS broadcast by the broadcast selecting switch. Then, converter power supply is output via the signal cable 13 while a control pulse is output together with this. Since the control pulse is a digital signal, it is hardly affected by voltage fluctuation, resulting In sure transmission.

The regulator 22 receives the converter power supply, and provides power supply to the control pulse detection circuit 23 and the microcomputer 24. The microcomputer 24 receives the control pulse from the control pulse detection circuit 23, and it decodes this control pulse and outputs the change-over control signal to the first change-over switch $SW_1$.

The first change-over switch $SW_1$ selects a BS broadcast terminal. Converter power supply is provided from the first change-over switch $SW_1$ to the BS converter 4 via the signal cable 5. By this, the BS converter 4 is driven to output BS broadcast signal. This BS broadcast signal is led to the change-over divider 6 via the signal cable 5 so as to reach the first output terminal $t_6$ via the first change-over switch $SW_1$. Then, it is output to the BS/CS receiver 17 via the signal cable 13.

In this situation, when the other BS/CS receivers 18–20 are also turned on and select a desired broadcast signal, respectively, the second to fourth change-over switches $SW_2$–$SW_4$ select a desired broadcast signal terminal, respectively. Converter power supply is provided to the $CS_1$ converter 7 and $CS_2$ converter 10 as selected, which are thus driven to output desired broadcast signals to the BS/CS receivers 18–20. Accordingly, disposing a single signal cable 13–16 to connect each of the BS/CS receivers 17–20 to the change-over divider 6 is sufficient to separately receive a desired broadcast.

Figure 3:
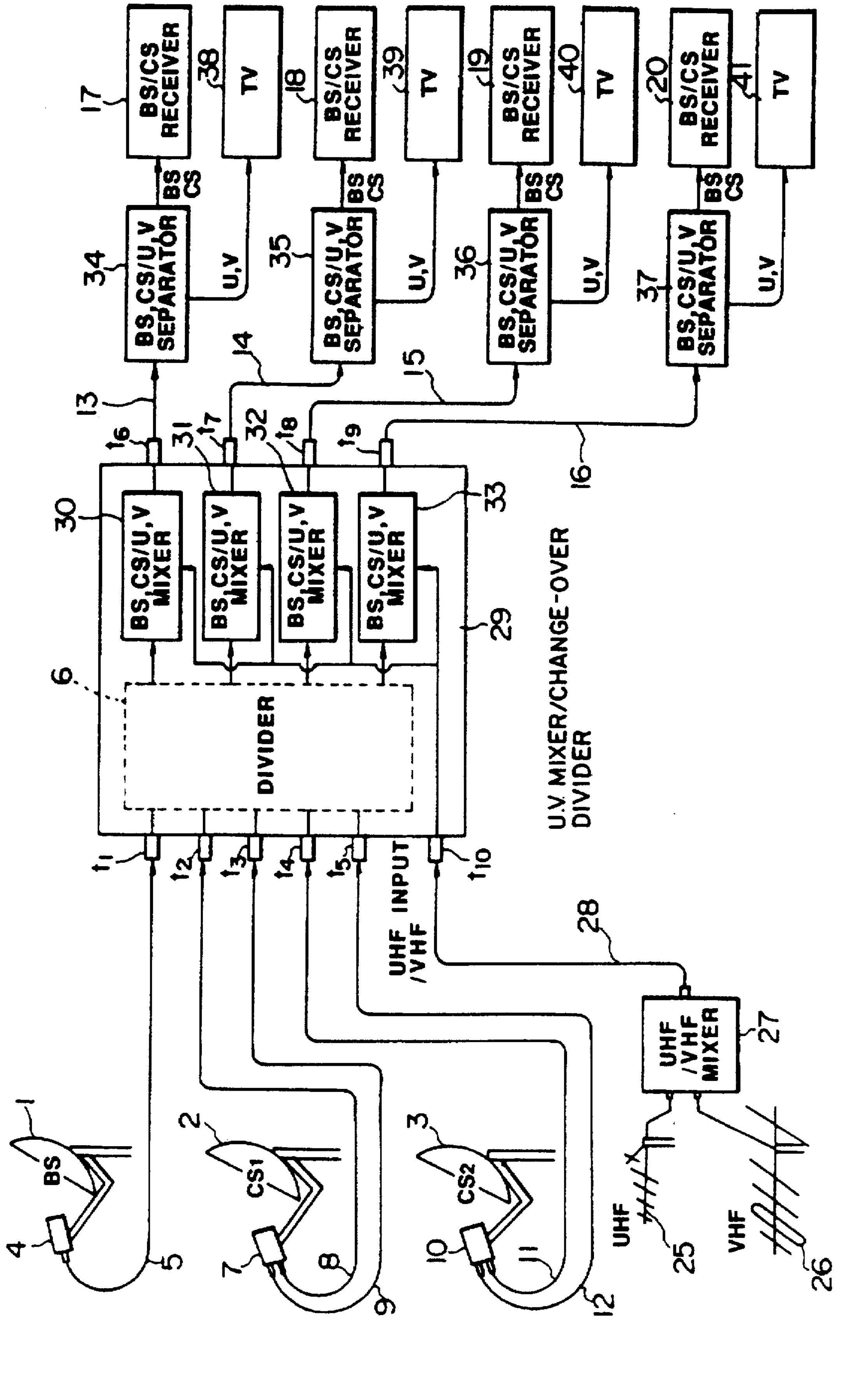
FIG. 3 is a view similar to FIG. 2, showing a broadcast receiving system (second preferred embodiment).

Referring to FIG. 3, a second preferred embodiment of the present invention will be described. The second preferred embodiment is constructed to be a system capable of receiving Ultra High Frequency (UHF) broadcast and Very High Frequency (VHF) in addition to satellite broadcast. FIG. 3 shows a circuit block diagram of a broadcast-receiving system.

Outputs of a UHF antenna 25 and a VHF antenna 26 are input to a UHF/VHF mixer 27 in which a UHF broadcast signal and a VHF broadcast signal are mixed together. Output of the UHF/VHF mixer 27 is led to a sixth input terminal $t_{10}$ of a U.V mixer/change-over divider 29 via a signal cable 28.

The U.V mixer/change-over divider 29 has first to fifth input terminals $t_1$–$t_5$ to which the same broadcast signals as the first preferred embodiment are input, and to which the change-over divider 6 having the same architecture as the first preferred embodiment is connected. Outputs of the change-over divider 6 are input to the BS.CS/U.V mixers 30–33, respectively, to which the sixth input terminal $t_{10}$ also connected, and in which satellite wave and ground wave are mixed together. Outputs of the mixers 30–33 are led to the first to fourth output terminals $t_6$–$t_9$, respectively.

The output terminals $t_6$–$t_9$ are connected to the signal cables 13–16 at one ends thereof, respectively. The signal cables 13–16 have the other ends connected to BS.CS/U.V separators 34–37, respectively. The separators 34–37 serve to separate satellite wave and ground wave, and output satellite wave to the BS/CS receivers 17–20 and ground wave to televisions (TVs) 38–41, respectively.

In this second preferred embodiment, the BS/CS receivers 17–20 can separately receive not only satellite broadcasts, but TVs 38–41 can receive UHF and VHF broadcasts.

In the above embodiments, the number of the output terminals $t_6$–$t_9$ is four, but it is not limited thereto and may be another.

What is claimed is:

1. A change-over divider for selecting at least one of a plurality of input signals, comprising:

a plurality of input terminals receiving respectively said plurality of input signals comprising broadcast satellite signals, communication satellite signals, and UHF broadcast signals;

a plurality of selector switches, each switch having a plurality of inputs respectively connected to receive said broadcast satellite signals and said communication satellite signals and each switch having an output terminal for outputting a selected one of said plurality of inputs;

a plurality of mixer means for mixing said broadcast satellite signals, said communication satellite signals, and said UHF broadcast signals and producing respective mixed output signals therefrom;

a plurality of input/output terminals connected respectively to said outputs of said plurality of mixer means and for receiving respective coded control pulses and power supply signals from respective external sources and for outputting said mixed output signals;

control pulse detection means connected to said plurality of input/output terminals for detecting said coded control pulses input through at least one of said plurality of input/output terminals; and a microcomputer connected to said plurality of selector switches and said control pulse detection means, said microcomputer decoding said coded control pulses and outputting a change-over control signal to one of said plurality of switches in response to said decoded control pulses, said one of said plurality of selector switches independently selecting one of said plurality of input signals in response to said change-over control signal supplied by said microcomputer.

2. A change-over divider as claimed in claim 1 wherein said control pulse detection means comprises:

control pulse extraction means for separating said control pulses from said power supply signals supplied therein through one of said plurality of input/output terminals.

3. A change-over divider as claimed in claim 1, wherein at least one of said plurality of mixed output signals from said plurality of input/output terminals is connected to separating means for separating said broadcast satellite signals and said communication satellite signals from said UHF broadcast signals.

4. A change-over divider as claimed in claim 1, further comprising a UHF mixer receiving at least said UHF input signal fed directly to each of said plurality of mixer means for mixing with said broadcast satellite signals and said communication satellite signals.

5. A change-over divider for selecting at least one of a plurality of input signals, comprising:

a plurality of input terminals respectively receiving a plurality of input signals comprising broadcast satellite signals, communication satellite signals, and VHF broadcast signals;

a plurality of selector switches, each having a plurality of inputs connected respectively to receive said broadcast satellite signals and said communication satellite signals and each switch having an output terminal for outputting a selected one of said plurality of inputs;

mixer means for mixing each said output from said plurality of switches and said VHF broadcast signals, and producing a respective plurality of mixed output signals;

a plurality of input/output terminals connected respectively to receive said plurality of mixed output signals from said mixer means and to receive coded control pulses and power supply signals from respective external sources and for respectively outputting said plurality of mixed output signals;

control pulse detection means connected to said plurality of input/output terminals for detecting said coded control pulses input through at least one of said plurality of input/output terminals; and a microcomputer connected to said control pulse detection means for decoding said coded control pulses and controlling said plurality of selector switches by outputting a change-over control signal to one of said plurality of selector switches in response to said decoded control pulses, whereby said one of said plurality of selector switches independently selects one of said broadcast satellite signals and said communication satellite signals in response to said change-over signal.

6. A change-over divider as claimed in claim 5, wherein at least one of said plurality of mixed output signals from said plurality of input/output terminals is connected to separating means for separating said broadcast satellite signals and said communication satellite signals from said VHF broadcast signals.

7. A change-over divider as claimed in claim 5, further comprising a VHF mixer receiving at least said VHF broadcast signal and producing a mixed input signal fed directly to said mixer means for mixing with said broadcast satellite signals and said communication satellite signals.

* * * * *